United States Patent

Masaki et al.

[11] Patent Number: 4,479,432
[45] Date of Patent: Oct. 30, 1984

[54] THICK FILM PRINTING METHOD

[75] Inventors: Tatsuo Masaki, Tanashi; Toyoshi Nishimoto, Tokyo; Kiyoshi Masui, Asaka, all of Japan

[73] Assignee: Toppan Printing Co., Ltd., Japan

[21] Appl. No.: 405,722

[22] Filed: Aug. 6, 1982

Related U.S. Application Data

[63] Continuation-in-part of Ser. No. 149,914, May 15, 1980, abandoned.

[51] Int. Cl.³ .......................... B41F 3/36; B41F 29/02
[52] U.S. Cl. .................................. 101/170; 101/154; 101/158; 101/151
[58] Field of Search ................. 101/170, 154, 151, 36, 101/41, 150, 153, 158, 163, 177, 217; 430/307; 156/901

[56] References Cited

U.S. PATENT DOCUMENTS

| | | | |
|---|---|---|---|
| 1,261,171 | 4/1918 | Smith | 101/151 |
| 1,804,139 | 5/1931 | Adsit et al. | 101/217 |
| 3,060,853 | 10/1962 | Remer | 101/157 X |
| 3,093,071 | 6/1963 | Taylor | 101/170 X |
| 3,255,695 | 6/1966 | Johnson et al. | 101/211 |
| 3,310,403 | 3/1967 | Bryan | 101/170 X |
| 3,701,317 | 10/1972 | Miyamoto et al. | 101/170 |
| 3,913,219 | 10/1975 | Lichtblau | 101/170 X |
| 4,060,031 | 11/1977 | Philipp | 101/163 |
| 4,209,551 | 6/1980 | Masaki | 101/154 X |

FOREIGN PATENT DOCUMENTS 7903224 10/1979 Netherlands ....................... 101/170

Primary Examiner—J. Reed Fisher
Attorney, Agent, or Firm—Lerner, David, Littenberg, Krumholz & Mentlik

[57] ABSTRACT

A transferring layer on a transfer cylinder improves separability for facilitating complete transfer of ink from the transferring layer onto the material to be printed. This separability arises from the inclusion of a fluorine compound or a silicone compound in the transferring layer. In order to prevent incomplete transfer of ink from an intaglio printing plate to this transferring layer of the transfer cylinder, the printing speed of the transfer cylinder relative to the plate is controlled, and at the same time the viscosity of the ink is kept in a certain range. The use of a screen mesh is eliminated, thus preventing various problems associated with its use. A fine pattern of thick film can thus be printed with accuracy on various materials including fragile materials and those with surface irregularities.

31 Claims, 14 Drawing Figures

FIG. 5
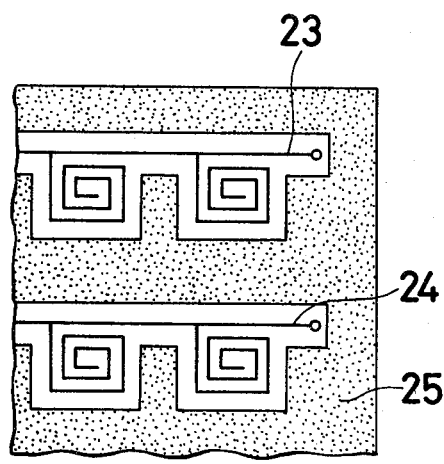
FIG. 6
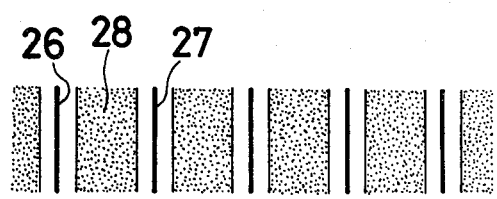
FIG.7a  FIG.7c 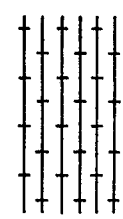
FIG.7b

THICK FILM PRINTING METHOD

CROSS-REFERENCE TO RELATED APPLICATION

This application is a continuation-in-part of applicant's U.S. Ser. No. 149,914 filed May 15, 1980 with the same title of invention, now abandoned.

BACKGROUND OF THE INVENTION

This invention relates to a thick film printing method by an intaglio offset printing device which uses a transferring body.

An important field in the electronics industry is the formation of fine conductive film patterns or fine resistance film patterns on substrates or electrode plates used in various electrical devices such as pringing circuits, liquid crystal display panels, plasma display panels and so on. These patterned conductive films or resistance films are advantageous in that the pattern density can be raised as the line width is made smaller. For example, photoetching is one of the most popular techniques for forming fine film patterns. In this method, a film of uniform thickness is formed on a substrate by means such as vacuum deposition, and the film is patterned using a photoresist and chemical corrosion. As such, this method requires many steps, and equipment and raw materials therefor are expensive. Since the photoetching method is costly, the application of this method tends to be limited to products of higher cost. Products are generally expensive if the line width of the fine patterns is 2-30 $\mu$(microns). The photoetching method is thus generally used to manufacture such products.

Among other conventional printing methods is the screen printing method wherein the thickness of the printed ink film can be made great. This method is advantageous in that discontinuities and thin sections are rare so that stable electric performance of the conductive film or resistance films can be obtained. However, since a screen mesh of stainless steel or nylon is made to cover a plate, deformation due to squeeze pressure is generated, and errors in dimensional accuracy or positioning accuracy tend to occur after a number of printings. Further, since ink reaches the material to be printed through the intermediary of the screen mesh, the shape of the boundary of the ink image is often irregular. In addition, it is difficult to print fine patterns with stability, for example, fine patterns of 100 $\mu$ or less line width. The printing pattern, depending on its shape, generates a moire phenomenon with the screen mesh, and a moire pattern on the printed material.

Thus, there has not been proposed in the prior art an appropriate method for printing an intermediate pattern whose line width is 30-300 $\mu$.

SUMMARY OF THE INVENTION

Accordingly, the present invention discloses a printing method wherein an intermediate pattern of 30-100 $\mu$ line width can be printed without presenting the problems mentioned above.

The method of the present invention provides improved dimensional accuracy and positioning accuracy over an area of 300 mm $\times$ 300 mm.

In accordance with the method of the present invention, the printed film thickness can be made to be over 5 $\mu$. Discontinuities and thin sections of the fine pattern are rare. Since it is possible to use an ink which includes large amounts of an additive such as a powder made of a conductive material, various characteristics and properties can be given to the printed ink pattern. Thus, the method of the present invention is applicable to various fields.

The materials to be printed by the method of the present invention may include not only paper and synthetic resin films but also ceramic and glass whose surfaces have small irregularities or three-dimensional patterns, as well as being rigid and nonabsorbent to ink. In accordance with the method of the present invention, a means is also disclosed for eliminating defects such as discontinuities in the conductive patterns.

As compared with other methods, in the present invention, an intaglio plate is used which can easily print a thick film, the use of screen mesh for forming fine patterns is eliminated, and the shape of image lines is regular. In order to facilitate printing on rigid or fragile materials and to obtain printed ink patterns of thick film, a transferring layer with a resilient layer of less than 30 degrees hardness (JIS Shore hardness A) is formed on a cylindrical cylinder. Printing is performed at a pressure lower than 10 kg/cm$^2$, thereby permitting a wider selection of materials to be printed. Further, a separating layer consisting of a material selected from the group of fluorine compounds and silicone compounds with good separability, i.e. readiness to separate ink, is formed on the surface of the transferring layer so that ink transfer from the transferring layer to the material to be printed is complete and the shape of the image lines (especially the line width) is always uniform. Although such a layer provides improved separability, this layer also poses a problem in that ink is hard to transfer from the intaglio plate to the transferring layer. In view of this problem, in the present invention, the printing speed of the transferring cylinder on the intaglio plate is kept below 100 mm/sec, and the viscosity of the ink is kept in the range of 50-2000 poises so as to facilitate the transfer of ink from the plate. Since the ink can be completely transferred from the transferring layer, the produced image is improved several times over the image produced by general offset printing wherein the transfer of ink from a blanket (corresponding to the transferring layer) to the material to be printed is about 50%. The improvement in reproducibility and stability is even more pronounced when the ink film is thick and the line width is small. If the ink were to remain on the part corresponding to the transferring layer in each printing as in the prior art when a pattern of less than 100 $\mu$ in line width and about 10 $\mu$ in thickness is required, the printed pattern would become blocked as the number of printings increases, so that an image of clear shape and distinct lines may not be obtained.

In addition to this, in the present invention, a single ink pattern is superposition-printed twice or more with the same printer utilizing the fact that the printing position precision is good in the offset printing method. The position on the surface of the transferring layer of the transfer cylinder receiving a predetermined ink pattern from an ink receptacle of an intaglio plate in the first printing is displaced from that in the second printing. Such displacement may be performed by slightly shifting the position of the transfer cylinder or its transferring layer relative to the ink receptacle of the intaglio plate, from the time of the first printing to that of the second printing. Of course, since superposition printing is to be performed, the position of the intaglio plate relative to the material to be printed does not change.

With the superposition printing method as described above, the printed ink pattern may have a large thickness. In addition, incomplete ink transfer which might be caused by contamination or the like on the surface of the transferring layer of the transfer cylinder may be compensated for, and discontinuities or pinholes in the ink patterns on the material to be printed may be prevented. According to the present invention, only one intaglio plate may be used for superposition printing. However, two or more intaglio plates (of the same ink receptacles) may be used in accordance with the number of superpositions, thus using one intaglio plate for the first printing and another intaglio plate for the second printing.

DETAILED DESCRIPTION OF THE DRAWINGS

FIG. 1 is a model view illustrating the overall printing method of the present invention.

FIGS. 2 (a)–2 (c) illustrate model views of an intaglio printing plate used in the method of the present invention. More particularly FIG. 2 (a) is a sectional view illustrating a surface layer of the intaglio printing plate before desired portions of the surface layer have been corroded or melted. FIG. 2 (b) is a sectional view illustrating the intaglio printing plate after corroding or melting; and FIG. 2 (c) is a sectional view of the intaglio printing plate obtained in the fourth example of the present invention.

FIG. 3 (a) is a plan view showing a printing pattern of a conventional method which includes a thick line; and FIG. 3 (b) is a plan view of an intaglio offset printing pattern used in accordance with the present invention wherein the thick line of FIG. 3 (a) is replaced by a collective body of fine lines.

FIG. 4 (a) is a plan view showing a pattern for an electrical connecting terminal of a conventional method consisting of a pattern of wide width; FIG. 4 (b) is a plan view showing the shape of the printed material obtained when the pattern of FIG. 4 (a) is printed by intaglio offset printing. FIGS. 4 (c) and 4 (d) show patterns used in accordance with the present invention wherein thick patterns are replaced by collective bodies of relatively fine patterns.

FIG. 5 is a schematic model view of a fine line intaglio offset printing plate of the present invention which is an improvement over conventional printing plates wherein wide unprinted parts are formed around fine lines.

FIG. 6 is a model view of an example in accordance with the method of the present invention wherein the distance between fine lines is great.

FIGS. 7 (a), 7 (b) and 7 (c) are plan views illustrating examples of dummy patterns.

Figure 8:
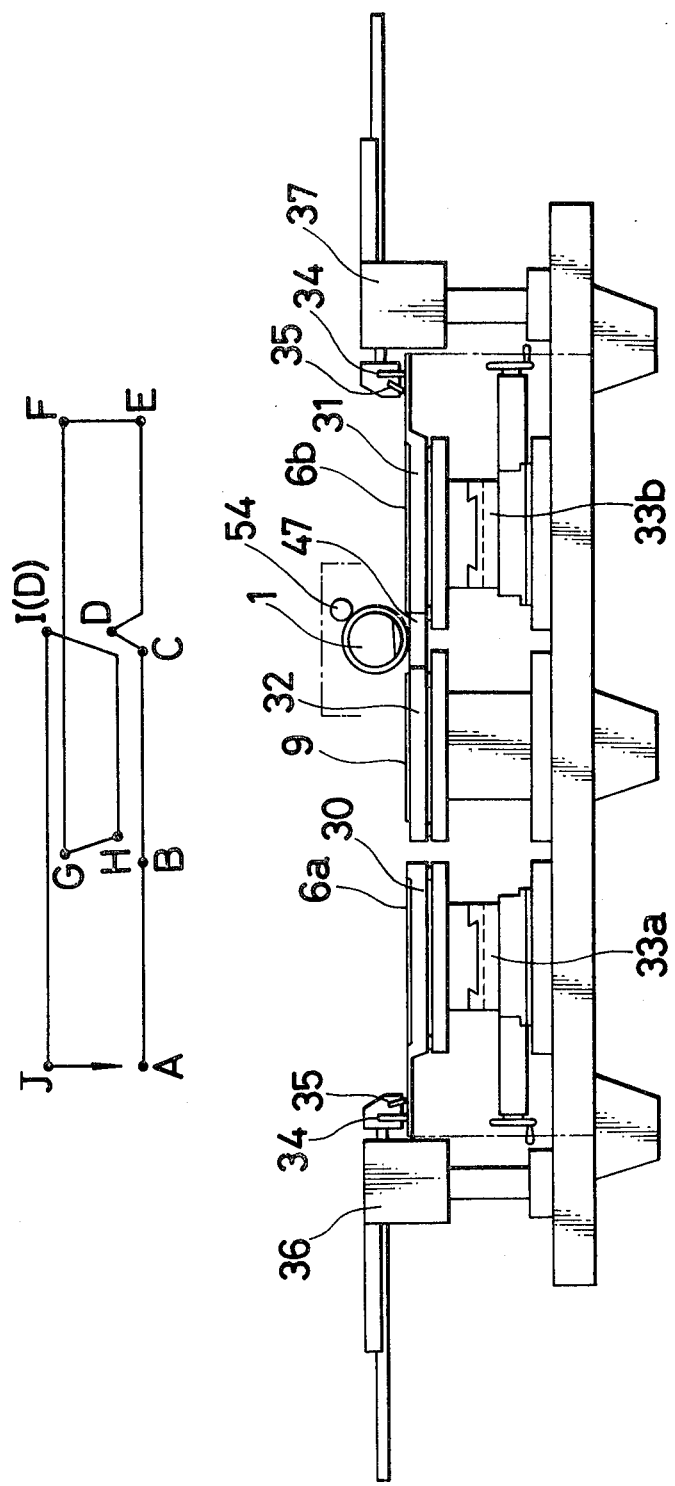

FIG. 8 is a schematic side view showing an example of a printing machine for practicing the method of the present invention.

Figure 9:
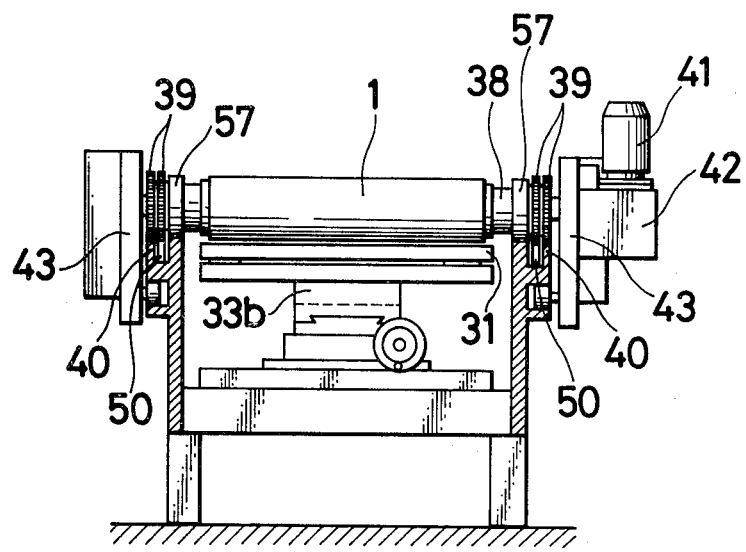

FIG. 9 is a partial sectional side view showing the printing machine shown in FIG. 8 for practicing the method of the present invention.

Figure 10:
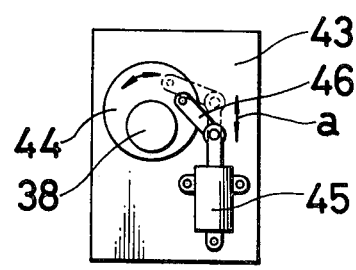

FIG. 10 is a view showing an example of a movable bearing used in the printing machine shown in FIG. 8.

Figure 11A:
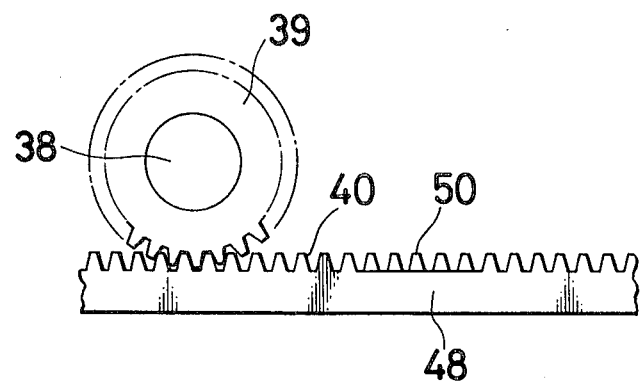
Figure 11B:
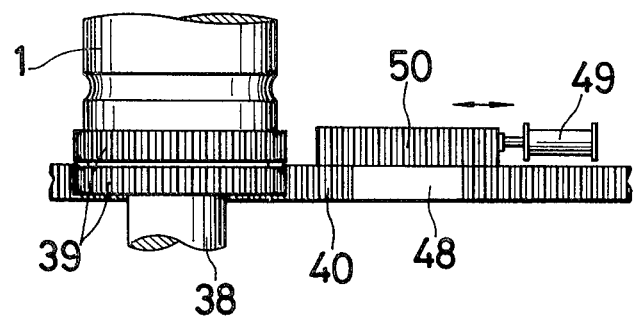

FIGS. 11 (a) and 11 (b) are views showing a mechanism for shifting a transfer cylinder of the printing machine shown in FIG. 8.

Figure 12:
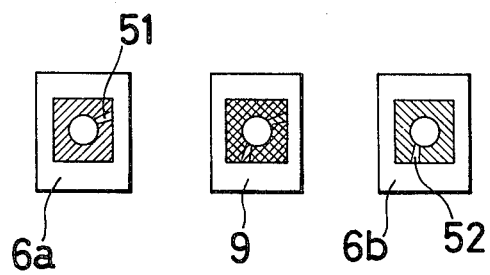

FIG. 12 is a view showing printed patterns on a material to be printed which are obtained by printing twice using two intaglio plates.

FIGS. 13 (a) and 13 (b) are views showing printed patterns on the material to be printed which are printed twice by a transfer cylinder which shifts position.

Figure 14:
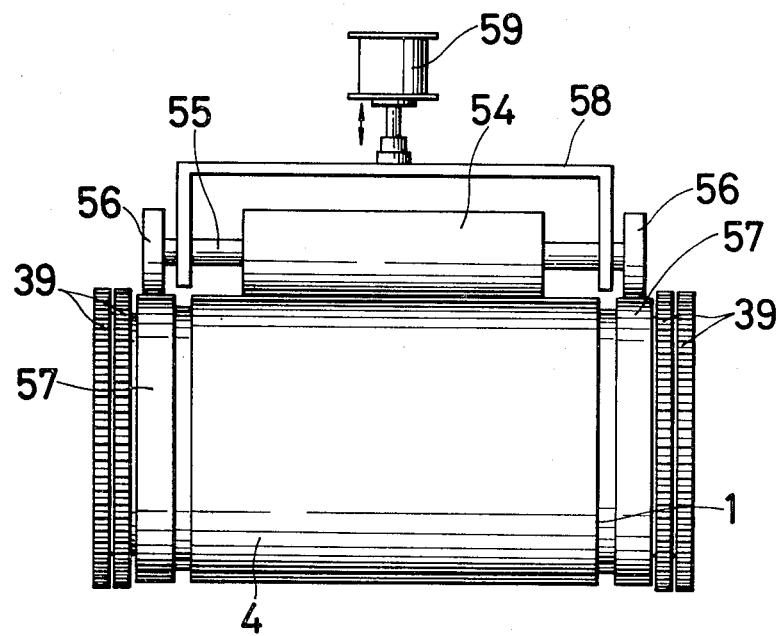

FIG. 14 is a view showing the positional relationship between the cleaning roller and the transfer cylinder.

DETAILED DESCRIPTION OF THE INVENTION

A transferring layer 4 on a transfer cylinder 1 has a function of separating and comprises a separating layer 2, which directly separates ink from the transferring layer 4 to materials to be printed, and a resilient layer 3 which has a suitable elasticity, rigidity and the ability to be instantaneously restored. In practice, the separating layer 2 consists of a fluorine compound such as trifluoro ethylene chloride resin, tetrafluoro ethylene-6-hexafluoro propylene copolymer resin, vinylidene fluoride-6-hexafluoride copolymer resin; or a silicone compound such as oil, rubber or varnish (resin).

Oil-like or rubber-like materials with the general formula shown below are preferable:

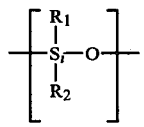

wherein $R_1$ and $R_2$ are methyl radicals, phenyl radicals, phenyl halide radicals, vinyl radicals, cyanoalkyl radicals or alkyl halide radicals. These materials may be directly coated or mixed with other resins or rubber compositions and coated. It is preferable to use silicone type elastomers oil or resins, especially, in effecting a complete ink transfer from the transferring layer 4 to the materials to be printed.

The thickness of the separating layer 2 is regulated depending upon the softness and thickness of the resilient layer 3 thereunder, as well as the softness of the separating layer 2 itself. The resilient layer 3 has a hardness below 30 degrees of rubber hardness (JIS Shore hardness A spring type meter), and a thickness of over 0.5 mm so as to enable printing on materials such as ceramic substrates which are warped or have irregularities of 0.1–0.2 mm and to avoid distorting the shape of the thick film ink pattern transferred from the intaglio plate. Thus, the hardness and the thickness of the separating layer 2 must be such that they do not destroy the elasticity of the soft body layer 3 thereunder. The rubber hardness must be below 30 degrees or the thickness must be over 0.5 mm. In the case of silicone elastomer which itself has a rubber hardness below 30 degrees and good separability, the transferring layer 4 need not be divided into the resilient layer 3 and the separating layer 2. A silicone elastomer with low rubber hardness is obtained by combining a base oil represented by diorganopolysiloxane having functional groups at its terminal; a bridging agent of silane or siloxane with more than three functional groups which are represented by ethyl-ortho-silicate or cohydrolyzed product of ethyl silicate and methyltrichlorosilane; and a catalyst such as dibutyl-tin-di-acetate, amine or quaternary ammonium salt. The combination is then mixed with a reinforcing filling agent such as silica, calcium carbonate or quartz and a hardness adjusting agent such as non-functional dimethyl polysiloxane or dimethyl polysiloxane with one functional group and it is cured. Silicone oils such as non-functional dimethyl polysiloxane are effective as an additive for improving separability.

Figure 1:
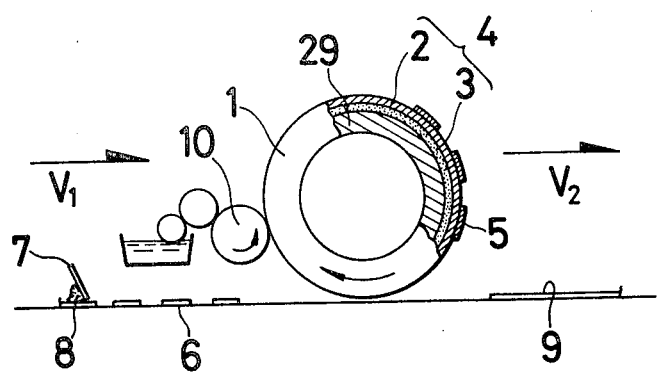

When silicone oil is used for the separating layer 2, the thickness of the layer 2 may be below ten microns. A diluting solution such as silicone oil, silicone gum or silicone varnish can be coated and applied on the surface of the transferring layer 4 by an oil or varnish solution impregnated roll 10 as shown in FIG. 1. The solution may alternatively be supplied from an oil tank through a metal roll to the transferring layer 4. Preferably, the solution has a viscosity of less than 50 poises.

For the resilient layer 3, urethane rubber, silicone rubber, SBR nitryl rubber, chloroprene rubber, butyl rubber, ethylene propylene rubber, gelatin compositions and so on which are below 30 degrees in rubber hardness are effective.

Further, it is preferable to use materials for the soft body or resilient layer 3 which are compressible so that doubling of the printed image may be eliminated. The resilient layer 3 may thus have a low rubber hardness for intaglio offset printing and still have sufficient mechanical strength such that complete transferring of ink is possible. Porous resins or foamed rubber are suitable compressible soft materials.

Other materials suitable for this are urethane foam or silicone RTV sponge which becomes a foamed body by carboxylating or dehydrogenating in polymerization curing; a foamed body which includes a heat decomposing foaming agent such as azodicarboxylic acid, azobisisobutyronitrile, dinitrosopentamethylenetetraamine, paratoluenesulfonylhydrazide or 4, 4'-hydroxybisbenzenesulfonylhydrazine and is prepared by heat polymerization, heat vulcanization or gelling; or a foamed body prepared by enclosing within thermo-plastic resin a micro capsule type hysical foaming agent having a solution which becomes a gas when heated and then undergoes heat polymerization, turning into a gel.

The transferring layer 4 of such a construction is directly adhered to the transfer cylinder 1. It may alternatively be adhered first to an iron plate, an aluminum pate, or a base cloth 0.3 mm in thickness, and then be attached to the transfer cylinder 1. The plate used in the present invention is an intaglio plate 6, and this requires at least 10 $\mu$ depth for accomplishing the thick film printing which is the object of the present invention. It is preferably in the range of 10–30 $\mu$ when the line width is in the range of 50–100 $\mu$, although it varies depending on the line width and the required thick film pattern characteristics.

The above specifications are sufficient to achieve the object of the present invention of general thick film printing. However, it is also possible to add special requirements to the method of the present invention to achieve specific results. For example, in the thick film printing which is the object of the present invention, the thickness of the film must be kept uniform, regardless of the line width. In the wiring patterns of display devices such as plasma display panels or fluorescent display tubes, a surrounding electrical pattern is wider than the inner pattern, and glass frit is arranged on the terminal part so as to adhere to the opposite glass plate for sealing. Then the inside is evacuated. After this wiring pattern printing film is printed, the resin contained in it is gasified, the frit is melted and the film is fired at a high temperature (generally 500°–900° C.) for hardening. However, in doing so, a pore for exhausting the resin gas is generated in the film. Thus, the fluorescent tube is degraded when the film at the electrical terminal part is thick, since the outer air tends to enter inside. Thus, it is preferable that the film be thin at the electrical terminal part. However, if it is too thin, the electrical resistance increases too much, and a uniform printed film as in the case of the internal wiring pattern is required. In such a case, a printing plate as in the example below which is different from a general etched metal plate satisfies the requirement.

Figure 2A:
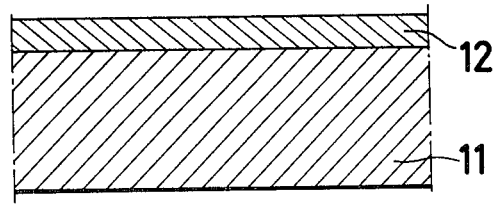
Figure 2B:
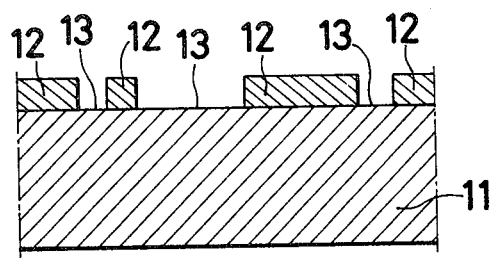

As shown in FIG. 2 (a), an intaglio printing surface layer 12 is uniformly formed on an intaglio printing base body 11 to a desired depth. The intaglio printing surface layer 12 and the intaglio printing base 11 must be combined in the manner described below. That is, the intaglio printing surface layer 12 must be able to corrode or melt in a corrosive solution or solvent to be used layer, and the intaglio printing base body 11 must be substantially corrosion resistant and non-meltable in that solution.

A corrosion resistance or non-melting part and a corrodible or melting part are formed in a desired pattern on the intaglio printing surface layer 12.

As shown in FIG. 2 (b), the part 13 of the intaglio printing surface layer 12 which is corrodible and meltable is corroded or melted until the intaglio printing base 11 is exposed, and the rest of the surface is left protruding so that an intaglio printing plate is obtained.

The intaglio printing surface layer 12 may or may not be photosensitive itself. When the intaglio layer 12 itself is not photosensitive, a pattern of the corrosion resistant or non-melting part and the corrodible or melting part can be formed by various known methods. For example, a photoresist may be coated, exposed and developed. By using such a plate, printed materials of uniform ink film thickness can be obtained.

Although this printing method is extremely suitable for thick film printing of fine patterns several tens of microns in width, it poses problems in forming patterns of wider line width. The first problem is that, in big rectangular or circular patterns with line widths of about 300 $\mu$, a pattern which is drastically different from the plate pattern tends to be printed. The periphery of the pattern may be extremely distorted and the central portion may be irregularly discontinuous. This is attributable to the printing procedure of the intaglio plate used in the printing. The ink supplied to the surface of the intaglio plate is uniformly doctored so as to uniformly distribute ink in the recessed part of the plate. The ink is transferred to the transferring body. However, with a big pattern whose line width is over 300 $\mu$, the doctoring element tends to eat into the recessed part and ink doctoring of uniform thickness is made difficult.

In such a case in accordance with the present invention, the big pattern whose line width is over 300 $\mu$ is replaced with a collective body of fine patterns having a plurality of mutually connecting parts 40–200 $\mu$, preferably 50–100 $\mu$ in width, and the distance between the lines is made smaller than the line width. The width of the fine lines forming these fine patterns may be suitably selected considering the specific requirements of the drawer for making an original image or the surrounding fine patterns for the printing plate. The line width is thus not particularly limited, and meeting this requirement is not difficult. In the case of a pattern wherein the line width is uniform throughout, the depth of the ink recessed part of the plate 6 is generally made uniform, so that a uniform ink film may be formed.

Figure 3A:
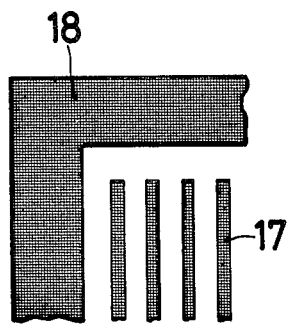
Figure 3B:
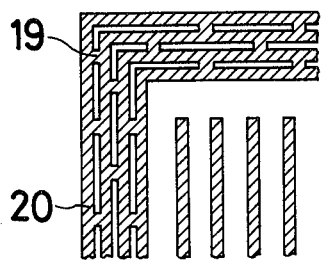
Figure 4A:
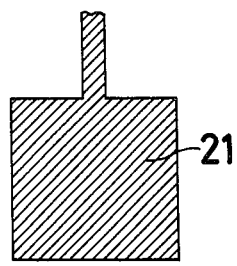
Figure 4B:
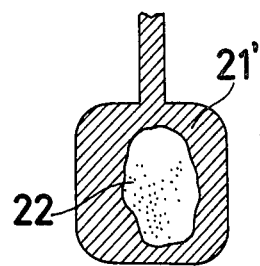
Figure 4C:
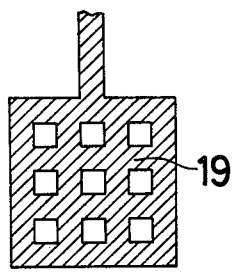
Figure 4D:
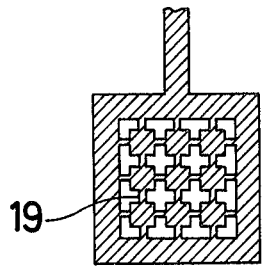

FIG. 3 (a) shows a prior art original pattern having both a fine line 17 from several tens of microns to 200 $\mu$ in width and a wide line 18 more than about 300 μ in width. In accordance with the present invention, the wide line pattern is, as seen from FIG. 3 (b), constituted from a collective body of fine lines 20 having a plurality of mutually connecting parts 19.

Referring to a pattern with a connecting terminal part 21 shown in FIG. 4 (a), when an original pattern as shown in FIG. 4 (a) is used, a distorted connecting terminal part 21' with a central dropout 22 as shown in FIG. 4 (b) is formed in the prior art. In the connecting terminal part 21, a contact point must be securely held to an external connecting wire, so that a big dropout is undesirable. Thus, in accordance with the present invention, it is preferable to design the connecting terminal part with smaller patterns as shown in FIGS. 4 (c) and 4 (d) so as to print a reproduced image which is considerably more faithful to the original desired image.

Although the intaglio offset printing method is extremely suitable for thick film printing of fine patterns consisting of lines several tens of microns in width as described above, it still poses a problem in that, depending upon the printing conditions, the fine lines may be irregular and become blurred in printing. These irregularities and blurs differ depending upon the quality of the ink, the printing speed, and the depth and width of the grooves (the ink recessed part) of the plate 6. This is particularly a problem when an unprinted space is provided around the grooves for fine lines and the pattern density is small. In practice, these irregularities and blurs tend to occur at the outermost line or the nearest line inside the group of fine lines which are aligned with a constant small pitch. Irregularities also tend to occur at the distal ends of each fine line, especially when the length of the lines is not regular and when there is a lot of white or unprinted space around the distal end of each line. They also occur even within the group of fine lines when the distance between the lines is extremely large as compared with the width of the fine lines.

FIG. 5 shows an improved printing plate for eliminating these line irregularities and blurs around the outer periphery or distal ends of the group of fine lines. An area 25 for a dummy pattern is formed in the white space outside fine line groups 23 and 24. FIG. 6 shows an example of an arrangement wherein a dummy pattern 28 is disposed between the lines when the distance between the fine lines 26 and 27 is wide. Since, the printed matter has the same pattern as the printing plate, the area in which the dummy pattern can be arranged is limited, depending upon the application of the printed wiring pattern.

In the improved printing plate, the ink conditions and the conditions of the processes of inking, doctoring and transferring on the transferring layer are made the same on the periphery of the fine line groups as in the other areas of the fine line groups so that partial irregularities within an effective pattern can be prevented. Further, the uniformity is also improved in the process of transferring from the transferring layer to the material to be printed, so that printed matter without irregularities may be obtained. With the printing plate in accordance with the present invention, advantages other than already mentioned are also obtained. The deformation of the transferring layer caused by contact between the grooves on the printing plate and the surface of the transferring layer is made uniform due to the presence of the dummy pattern, and the overall distortion and the quality of the fine line patterns is also improved.

Ink 8 is inked on the plate 6 of FIG. 1 as mentioned above by a doctor element or squeegee 7. The ink is immediately transferred from the plate 6 to the transferring layer 4 on the transfer cylinder 1 at a transferring speed of $V_1$. Inking may be performed by filling ink on a roll, and the excess ink may be wiped off by a cloth or paper. Since the surface of the transferring layer 4 has separability, a conventional type of ink for intaglio printing or an offset printing type ink will not be transferred to the transferring layer 4 due to their excessively high viscosities. On the other hand, so-called gravure ink cannot reproduce fine patterns due to its low viscosity. A screen type ink intermediate to these two types of ink is nearest to the ink used in the present invention. An ink in the range of 50–2000 poises in viscosity is suitable for inking and transferring fine patterns.

The thick film printing which is the object of the present invention is a technology for reproduction of fine lines in the field of electronics. The ink used in this field is required to have a larger amount of solid material, for example, more than 50% by weight of the ink. Such a high solid component ink cannot be used for regular printing. This is because the tackiness of the ink is too low and the flowability of the ink is too small. The particles of the solid component are relatively large, having a particle distribution of 1–10 μ, as compared to an ordinary lithographic offset printing ink which has pigment particles around 0.1 μ in diameter. For example, in the case of gold powder wherein the pattern is fired at a high temperature of 500°–1000° C. after printing to be adhered to ceramic or glass, adhesion is degraded when the particle size is too fine.

There has not been proposed a conventional method for patterning ink containing a solid component of large particle diameter with fine lines on ceramic or glass. In the method of the present invention, it is possible to print with ink containing 50% by weight of solid component, but also with ink as high as 60–95% by weight, considering density of the solid component and the mutual contact of the solid particles in the range of 50–2000 poises. After printing, the ink is fired at a temperature of 500°–900° C. Frequently, glass frit having a melting point of 300°–700° C. is mixed in order to facilitate the adhesion of the ink to the substrate. As a binder resin for high solid component resins containing such glass frit, ultraviolet curing resins can have suitable viscosity without requiring a volatile solvent. Since no volatile material is used, clogging in the plate will not occur even when the lines are fine. Further, since the solvent component is small, the transferring layer 4 made of rubber, which tends to swell in the presence of a solvent component, can be used for printing with stability. In addition, ultraviolet irradiation can be done after printing so as to prevent running or secondary flow of the pattern after printing.

For the ultraviolet curing resin varnish, which may be from about 5 to about 40 percent by weight, in accordance with the present invention, conventional varnishes of various compositions can be used. Such a varnish includes as an essential component, a prepolymer with a radical polymerizing type unsaturated radical, a polymerizing unsaturated monomer, and a sensitizer. Prepolymers which may be used include methacrylate of epoxy resin, methacrylate of polyurethane, methacrylate of polyester or alkyd resin, an unsaturated polyester, methacrylate of polyhydric alcohol and so on. Monomers which may be used include methacrylic ester, styrene and so on. Sensitizers which may be used include allyl ketones, disonfides, and benzoins. An example of an ultraviolet curing resin varnish suitable for the present invention is a varnish 100 grams in weight which contains 0.04–1.50 mol of ethylene unsaturated radical such as meth acryloyl radical, or a varnish which contains 0.04–1.50 mol of methacryloyl radical and at least one saturated polyester resin, unsaturated polyester resin or alkyd resin. Examples of saturated polyester resins include copolycondensed products of terephthalic acid or isophthalic acid and ethylene oxide. An example of an unsaturated polyester resin is a copolycondensed product of polyhydric alchohol, such as ethylene glycol and saturated dibasic acid such as maleic anhydride. The alkyd resin may be copolycondensed and partially oil modified product of polyhydric alcohol such as pentaerythritol and polybasic acid such as phthalic anhydride or a mixture of this with methacrylic acid.

An ink which used polyester or acryl type resin for the ink of the present invention was fired relatively slowly, and the film shape was not damaged during the firing. The ink was thus proven to be advantageous. The solid component in the ink of the present invention may be color pigment; conductive material such as gold, silver, aluminum, platinum, or graphite-carbon; a resistance material such as ruthenium, palladium or rhodium; a magnetic material such as iron oxide or chrome oxide; a dielectric material such as alumina; a fluorescent material such as zinc sulfide; or tin, cadmium sulfide or copper oxide. The particle diameter is usually 1–10 $\mu$.

In the present invention, the complete transferring of a printing ink pattern 5 from the transferring layer 4 onto material to be printed 9 is most important. The effect can be strengthened not only by rendering the transferring layer 4 separable, but also by lowering an adhesiveness of the ink itself. An adhesiveness reducing agent is added to the ink. The reducing agent may be polyhydric alcohol such as ethylene glycol, diethylene glycol, triethylene glycol, propylene glycol, glycerin, or sorbitol; wax; parrafin; or fluorine-containing resin. The addition of an organopolysiloxane group is most effective.

Further, depending on the ink, an oil such as dimethylpolysiloxane or a varnish such as silicone denatured alkyd phenol, epoxy, urethane, acryl, or polyester is added to the ink vehicle. The amount is less than 50% by weight of the ink vehicle (the component of the ink excluding the solid component). When it exceeds this limit the condensing force of the ink film itself is decreased, and defects such as separation of the ink layer in the transferring procedure might occur.

When the relatively flexible transferring layer 4 and an ink of low viscosity is used, the ink transferring pressure must be under 10 kg/cm$^2$. Otherwise, printed material with sharp pattern clean, shapes and sufficient ink film thickness will not be obtained even when a very resilient transferring layer 4 is used. Especially when a fine pattern less than 150 $\mu$ in line width is required, slure of the ink pattern tends to occur. Therefore, the printing is performed under a pressure lower than the transferring pressure as mentioned above. Printing at such a low pressure is also advantageous for the construction of the printer. Further, in transferring ink 8 in a printing ink pattern 5 on the transferring layer 4, a sufficient film thickness is not obtained at the same rotational speed as in a regular lithographic offset printer. In accordance with the present invention, it has been found that 30–70% of the ink within the intaglio plate can be transferred from the transferring layer 4 without damaging the shape of the pattern at a transferring speed $V_1$ of 100 mm/sec–1.0 mm/sec on the plate 6. At a transferring speed of more than 100 mm/sec, the ink used in the present invention is not adequately transferred onto the separating layer 2 of the transferring layer 4, so that only an extremely thin film is obtained and the shape of the printed pattern tends to be discontinuous.

The printing ink pattern 5 transferred on the transferring layer 4 is transferred at a transferring speed of $V_2$. When $V_2$ is too slow, the printing ink pattern is blocked between the material to be printed 9 and the transferring layer 4, generating overlapping or ink slure. When it is too fast, the complete transferring of ink is hard to accomplish. The transferring speed is preferably in the range of 2.0–400 mm/sec.

In the present invention, an offset method is used for accomplishing thick film printing with accuracy on fragile materials to be printed, which higher accuracy would not normally be expected on materials such as ceramic or glass. Since the method of the present invention incorporates the intermediacy of a transferring body such as the transferring layer 4, pinhole defects and discontinuities may tend to be generated in the printed material due to the adhesion of dust, or the presence of pinholes or scratches on the surface of the transferring layer 4. The transferring layer 4 especially tends to attract dust, and is always coated with viscous ink during printing, so that dust once adhered to the layer will not be removed if the transferring layer is not cleaned. The pinhole defects or discontinuities thus generated can be almost eliminated by utilizing another machine (the plate 6 and the transferring layer 4 are one set), since the pinhole defects or discontinuities are small defects and do not recur at the same places as different plates or in a repeated pattern on the transferring layer. However, the pinhole defects and discontinuities become a big problem in the field of thick film printing wherein high precision printing transfer is required for printing a pattern of 50 $\mu$ line width with a positional precision of ±5 $\mu$.

In such a case, it is difficult to retain the same mutual relationship between the plate and the material to be printed even when another identical plate is made, the same machine is used and the same printing pressure is set. It is practically impossible to accomplish superposition with the same accuracy.

In order to solve these problems, in the present invention, superposition of the same pattern more than once is performed utilizing the superior transferring accuracy of the offset printing method so as to increase the film thickness. Thus, pinhole defects and discontinuities are eliminated. When superposing more than once, the position of the surface of the transferring layer 4 is shifted from the first printing time at least once so as to eliminate the pinhole defects and discontinuities.

In actual printing, the printing material may be held stationary so as to superpose twice, three times or more. Alternatively, a number of substrates may each be printed one time. When a group of substrates are printed, they may be placed in the printed material positioning device inside the printing press for a second printing. In either case, after each printing or after every several printings, the surface position of the transferring layer 4 is shifted so as to eliminate the generation of pinhole defects and discontinuities due to stationary defects in the surface of the transferring layer 4. With the same press, since the relative position of the plate and the material to be printed is set, the accuracy is determined by the movement and the shape of the transfer cylinder 1 (including the transferring layer). Thus, it suffices to transversely displace the transferring layer 4 slightly (when the rubber sheet is used) on the surface of the cylinder 1 or to rotationally displace the layer 4 along the circumference of the cylinder. Of course, the thickness of the transferring layer 4 corresponding to the pattern must be uniform. However, small differences in thickness can be compensated for by decreasing the length of the shift of the transferring layer 4, so that this difference does not influence the accuracy of the transferring position of the pattern. Since the dust generating the pinhole defects and discontinuities is on the order of 50–100 $\mu$, a small shift will suffice. When printing each substrate twice or three times, shifting the substrate requires a lot of labor. However, with the cylinder type transferring method, a slide layer 29 for supporting the transferring layer 4 is formed on the surface of the transfer cylinder 1 as shown in FIG. 1. The slide layer 29 is slidably disposed on the transfer cylinder 1 as needed.

The pinhole defects and discontinuities can be eliminated by slightly shifting the surface of the transferring layer 4. Thus, printing can be performed in an environment where dust is abundant, without worrying about the generation of pinhole defects and discontinuities.

In the present invention, the discontinuities and pinhole defects are eliminated in more than superposition. Thus, if the line or image is blurred or ink stained, this method is not applicable for thick film printing. In normal offset printing, as the number of superpositions increases, the ink tends to be incompletely transferred to the material to be printed; it accumulates on the surface of the transferring layer 4, and the image tends to be stained with ink. In order to solve this problem, the surface of the transferring layer 4 is made of a silicone compound or a fluorine compound for improving the separability. Thus, the transfer is completely accomplished each time, so that blurring or stains of ink is prevented, and an improved image is obtained.

Various measures may be taken in the shifting step of shifting the position of the transferring surface of the transfer cylinder 1 which receives the ink from the intaglio plate. Typically, the transfer cylinder 1 itself is shifted or the transferring layer 4 formed on the transfer cylinder 1 is shifted relative to the base body of the transfer cylinder 1. In order to change the positional relationship between the intaglio plate 6 and a material to be printed 9 by shifting the transferring layer 4:

(I) the transferring layer 4 is rotationally shifted relative to the rotating axis of the transfer cylinder 1, or (II) the transferring layer 4 is axially shifted relative to the rotating axis of the transfer cylinder 1. If the transferring layer 4 is shifted, the position of the transfer cylinder 1 relative to the intaglio plate 6 or to the material to be printed 9 is maintained.

Alternatively, another method may be adopted wherein the transfer cylinder 1 itself is shifted and the transferring layer 4 is kept stationary.

In order to shift the transfer cylinder 1 relative to the intaglio plate 6 or to the material to be printed 9:

(I) an extra rotational force is supplied to the transfer cylinder 1 or the rotation of the transfer cylinder 1 is suppressed to rotationally shift the transfer cylinder 1;

(II) the transfer cylinder 1 is transversely shifted along the rotating axis thereof; or (III) the transfer cylinder 1 is shifted by sliding it along its direction of travel.

When the transferring surface of the transfer cylinder 1 relative to the intaglio plate 6 and to the material to be printed 9 is varied for each superposition printing by shifting the transfer cylinder 1 or the transferring layer 4, poor printing due to contamination on the transferring surface may be prevented. If two or more intaglio plates are used in correspondence with the number of superpositions, the defects inherent in the intaglio plate 6 may also be eliminated by superposition.

In an example of a printing machine shown in FIG. 8, two intaglio plates 6a and 6b having ink receptacles of identical shapes are used. The intaglio plates 6a and 6b and the material to be printed 9 are so positioned that superposition printing may be performed. A transfer cylinder 1 reciprocates between the two intaglio plates 6a and 6b and the material to be printed 9 to transfer ink onto the material to be printed 9 twice or more. The transfer cylinder 1 transfers the ink received from the two intaglio plates to the same position on the material to be printed 9. At the same time, the transfer cylinder 1 receives ink from one intaglio plate 6a at a position different from that for the other intaglio plate 6b.

FIG. 8 is a schematic view of an example of a printing machine for practicing the method of the present invention. Referring to FIG. 8, flat intaglio plates 6a and 6b are fixed on plate slides 30 and 31, respectively. A stationary table 32 on which the material to be printed 9 is placed is arranged substantially midway between the intaglio plates 6a and 6b. The plate slides 30 and 31 are respectively placed on fine adjustment beds 33a and 33b which are capable of moving around and rotating within a horizontal plane so as to allow fine adjustment of the positions of the intaglio plates 6a and 6b relative to the material to be printed 9. In the printing machine shown in FIG. 8, inking units 36 and 37 are respectively arranged at the right and left ends of the printing machine, and each has a squeegee 34 for supplying ink to the intaglio plates 6a or 6b and a doctor element 35 for filling ink into the recess of the receptacle of the corresponding intaglio plate. These inking units 36 and 37 reciprocate by air cylinders so that the squeegees 34 and the doctor elements 35 move along the surfaces of the intaglio plates 6a and 6b. Ink may be supplied to the intaglio plates 6a and 6b by nozzles (not shown) which are capable of automatically intermittently supplying ink between each pair of a squeegee 34 and a doctor element 35.

As seen in the side view in FIG. 9, the transfer cylinder 1 has a pinion gear 39 at each end of a core rod 38 thereof. These pinion gears 39 mesh with rack gears 40 of the printing machine main body so that the transfer cylinder 1 may be movable along a fixed path. Thus, by means of an electric motor 41, a reduction gear mechanism 42 and a control circuit (not shown), the transfer cylinder 1 reciprocates between the intaglio plate 6a or 6b and the material to be printed 9. Each pinion gear 39 has two trains of teeth for the reason to be described later. The core rod 38 of the transfer cylinder 1 is pivotally supported by movable bearings 43. The movable bearings 43 serve to cause the transfer cylinder 1 to float so that the transfer cylinder 1 may be temporarily released from the printing state. More specifically, as shown schematically in FIG. 10, each movable bearing 43 comprises an eccentric bearing 44 for supporting the core rod 38 of the transfer cylinder 1, and a hydraulic or air cylinder 45 for rotating the eccentric bearing 44 through a small angle. A vertical stroke (a) of the cylinder 45 slightly rotates the eccentric bearing 44 so as to slightly float the transfer cylinder 1. The floating distance of the transfer cylinder 1 must be such that the transfer cylinder 1 may be released from the printing state, and is typically 2 to 3 mm.

The mechanism for causing the transfer cylinder 1 to receive ink from one intaglio plate 6a at a surface portion of the transferring layer which is different from that for the other intaglio plate 6b will now be described. In the course of reciprocal movement between the intaglio plate 6a or 6b and the material to be printed 9, the meshing between the pinion gears 39 and the rack gears 40 is displaced by several teeth so as to slidably shift the transfer cylinder 1 along the direction of its travel. The printing machine shown in FIG. 8 has a displacing mechanism 47 which is interposed between the material to be printed 9 and the intaglio plate 6b. The pinion gear 39 coupled to the core rod 38 of the transfer cylinder 1 has a thickness at the side of the printing machine main body about twice that of the rack gear 40. The rack gear 40 has a blank portion 48 with no teeth at the part corresponding to a gear change. Instead, a movable rack 50 which is reciprocally driven by a reciprocating unit 49 such as a hydraulic or air cylinder is mounted at the side of the blank portion 48. When the movable rack 50 is reciprocally driven by the reciprocating unit 49, the meshing position of the pinion gear 39 with the rack gear 40 slides and is displaced.

The thick film printing method of the present invention has been described above. The movement of the transfer cylinder 1 will be shown and one cycle of the printing method of the present invention will be described, referring to FIG. 8. Symbols A to J at the upper portion of FIG. 8 represent points on the path of movement of the transfer cylinder 1. In one cycle from point A to point J, two gear change operations are preformed and the transfer cylinder 1 is vertically reciprocated several times to repeat the printing and non-printing states. The series of these operations are controlled by a control circuit. The Table below shows details of one cycle at each point on the path of movement of the transfer cylinder 1.

| Point | Upper and Lower Position of Transfer Cylinder | Gear Meshing Phase | Ink Transfer | |
|---|---|---|---|---|
| A→B | Lower | Correct Phase | Plate 6a→ | Trans |
| B→C | Lower | Correct Phase | Trans→ | Material to be Printed 9 |
| D | Upper | Gear Change | — | |
| D→E | Lower | Displaced Phase | Plate 6b→ | Trans. |
| E→F | Upper | Displaced Phase | — | |
| H→I | Lower | Displaced Phase | Trans.→ | Material to be Printed |
| I(D) | Upper | Gear Change | — | |
| I→J | Upper | Correct Phase | — | | where Trans. represents the transfer cylinder 1.

Figure 13A:
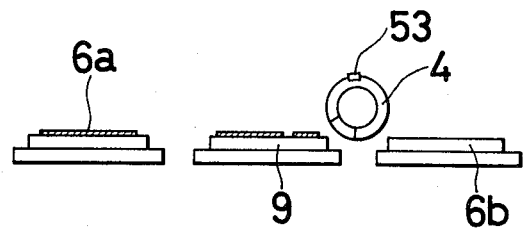
Figure 13B:
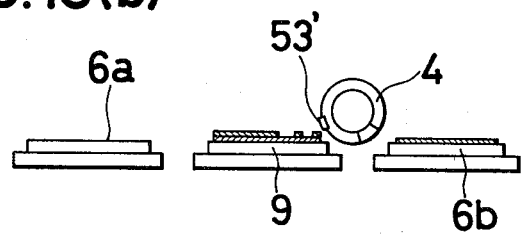

According to the method of the present invention, even if the intaglio plate 6a has an inherent defect 51 and the intaglio plate 6b has an inherent defect 52 as shown in FIG. 12, the image printed on the material to be printed 9 by two superpositions is compensated for these defects of the intaglio plates 6a and 6b. As for the transfer cylinder 1, even if the ink from the intaglio plate 6a forms a transfer defect 53 on the surface of the transferring layer 4 of the transfer cylinder 1 due to contamination or the like on the surface of the transferring surface, as shown in FIGS. 13(a) and 13(b), a transfer defect 53' of the ink from the intaglio plate 6b is at a different position relative to the material to be printed 9 since the transferring surface for the intaglio plate 6a is different from that for the intaglio plate 6b. As a result, the ink patterns formed by superposition printings compensate each other to reduce defects of the printed image.

A cleaning roller for removing contamination or residual ink on the transferring surface of the transfer cylinder 1 may be arranged in contact with the transfer cylinder 1. A cleaning roller 54 rotates in contact with the surface of the transferring layer 55 of the transfer cylinder 1. A rotation transmission wheel 56 of hard rubber is mounted at each end of a shaft 55 of the cleaning roller 54. These rotation transmission wheels 56 are urged against idlers 57 inside the pinion gears 39 to rotate the cleaning roller 54. The cleaning roller 54 is supported by a roller holding bracket 58 and is brought into contact with and separated from the transfer cylinder 1 at a desired frequency by a reciprocating air cylinder 59. The surface of the cleaning roller 54 is made of urethane rubber or of a metal plated with chrome and removes contamination or residual ink on the transferring layer 4.

Although the shape of the plate 6 has not been particularly mentioned, it may be cylindrical or flat. The cylindrical type is especially advantageous in that it can be simplified in construction for doctoring, as compared with the flat type, and the accuracy of the plate is superior. In either case, the plate and the transfer cylinder rotate or are moved in synchronism. The surface speed of each is determined, depending on the diameter of the transfer cylinder 1, the printing pressure of each, and the hardness of the transferring layer 4. Thus, each might have an independent driving device for rotation. The same applies to the material to be printed 9 and the transfer cylinder 1.

With the above printing method, it has become possible to accomplish thick film printing of very fine lines on glass, ceramic or metal and to provide various patterns with stable reproducibility. In order to facilitate the complete transfer of the ink pattern 5 from the transferring layer 4 to the printing surface of the material to be printed 9, a processing agent for rendering surface affinity and adhesiveness to the ink may be coated on the material to be printed in advance. However, the processing agent may not contain materials which damage the material to be printed, deform or distort the pattern, or degrade the adhesion of the pattern in latter processes such as heat firing. The film thickness of the processing agent must also be controlled for the same reasons. For the processing agent, a water soluble resin such as acrylic resin (e.g., "Dianal BR-85" manufactured by Mitsubishi Rayon Co., Ltd.) or the same type viscosity agent (e.g., "Oribain 6084" manufactured by Toyo Ink Mfg. Co., Ltd., "PE121" manufactured by Nippon Carbide Ind. Co., Ltd), ethyl cellulose (Hercules N-7 by Hercules Incorporated), nitrocellulose ("KC-2000" manufactured by Toyo Ink Mfg. Co., Ltd.), isocyanate ("Coronate L" manufactured by Nippon Polyurethane Inc. Co., Ltd.), PVA or the like is diluted in a solvent and coated in a thin film on the material to be printed. The thickness of the film is controlled to be 1–20 μ after drying. If the film is too thin, it will not facilitate the transfer of ink. If the film is too thick, it may melt in the heating process to follow and flow. Application may be accomplished by dipping, spraying, or roll coating. It is also possible to coat the solution on the ink separating paper in advance so that it may be transferred when semidried to the material to be printed. This means is effective in surface processing materials with porous surfaces, such as ceramic. With such processing, the transfer to the material to be printed becomes easy, and drooping of the image after printing is eliminated. Further, it becomes possible to transfer the pattern after it has dried somewhat, and damage to the image due to pressure during the transferring is eliminated. Thus, a printing pattern with improved accuracy is obtained.

EXAMPLE 1

A pattern, formed on a plate, having 524 lines with each line having a depth of 30 82 , a width of 50 μ, a pitch of 100 μ and a length of 100 mm was transferred and printed by intaglio offset printing using a printing press (Flat Base Lithographic Proofreader "DS-E" of Dainippon Screen K.K.). A urethane rubber layer having a thickness of 2.5 mm and a hardness of 25 degrees was provided on the surface of an iron cylinder as a transferring layer. An adhesion improving agent ("D-Primer" of Shinetsu Silicone K.K.) was coated thereon, and then a mixture of 100 parts of a silicone rubber of the type which vulcanizes at room temperature ("KE 116 RTV" of Shinetsu Silicone K.K.), 50 parts of a silicone oil ("RTV Thinner") and 0.5 parts of a curing catalyst ("RM") was applied and cured to form a surface separating layer having a thickness of 0.5 mm. The cylinder having such a transferring layer was rotated at a velocity of 50 mm/sec and a pressure of less than 4 kg/cm² to transfer ink from the plate, and the ink pattern was transferred for printing at a pressure of 5 kg/cm² and a velocity of 250 mm/sec to a glass substrate. The ink used therefor was a gold ink as follows:

"Au-4423" (Shoei Kagaku Kogyo) Butyl carbitol acetate added in the amount of 5 percent with respect to the total weight. Viscosity at the time of application: 600 poises (determined by BROOK FIELD VISCOMETER, HBT SC-14)

Pressures were measured by means of a pressure scale manufactured by Fuji Photo Film K.K. (for use with super low pressures). The printed pattern showed distinct stripes having line widths of about 45 μ and a film thickness of 12 μ. The firing of the pattern provided a favorable conductive pattern. Two hundred consecutive printings gave substantially the same pattern.

EXAMPLE 2

In accordance with Example 1, in printing, 3% acetone solution of a silicone varnish ("KS 707" of Shinetsu Silicone Kogyo) was coated by means of an impregnated roll (cloth roll) 10 shown in FIG. 1 with consecutive dilutions at every printing. It was found that the ink was fully transferred from the transferring layer for 500 printings and the printed patterns remained in good condition.

EXAMPLE 3

An aluminum substrate was coated with "Oribain BCS 3459" (manufactured by Toyo Ink Mfg. Co., Ltd.), and then a urethane foam sheet having a thickness of 2.4 mm and a rubber hardness of zero degrees (manufactured by Kokoku Kagaku Kogyo K.K.) was bonded thereto. The urethane foam sheet was then coated with "D-Primer" manufactured by Shinetsu Silicone K.K. A silicone rubber surface layer was formed thereafter by thoroughly mixing 100 parts of "KE 116 RTV" of Shinetsu Silicone K.K., 15 parts of "KF 69 L" and 0.5 parts of "DM", defoaming it in vacuo and curing it to form a silicone rubber surface layer having a total thickness of 3.0 mm and a hardness of 3 degrees.

Using a testing plate having a combination of patterns with line widths of 200 to 50 μ and a line depth of 30 μ, and using the transferring layer of the printer of Example 1, the pattern was printed. Comparison of the printed patterns obtained in this example with those of Example 1 revealed that the patterns of this Example, which were obtained by using such a transferring layer having a foamed layer, were remarkably superior in reproduction of the pattern in the direction orthogonal to the printing direction (the direction of rotation of the transferring cylinder) and showed fewer ink stains and less overlapping.

A test for resistance to printing, i.e. for measuring how many times a pattern can provide good transferring properties, revealed that the transferring layer having no foamed layer gave a less glossy surface after 100 transfers, whereas the transferring layer with the foamed layer gave the same reproduction in surface gloss even after 200 transfers.

EXAMPLE 4

An electrode glass substrate composed of a group of lines having line widths of 20 μ to 50 μ was printed in accordance with the procedures of Example 1 using a printing plate which was prepared by the process explained hereinbelow. The printing plate thus prepared gave a uniformly thick coating of ink and facilitated the provision of an insulating layer at the post-treatment step and a uniform resistivity to conductivity after firing.

Figure 2C:
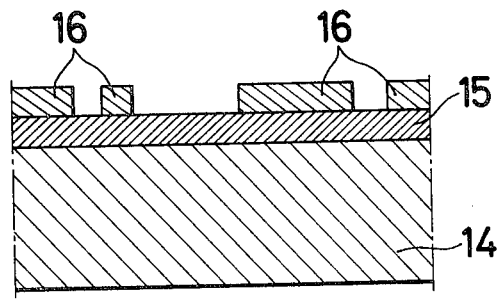

The printing plate was prepared by applying nickel plating 15 to printing steel 14 with a thickness of 1 mm (manufactured by Fuji Shinko K.K.) as shown in FIG. 2(c). The composition of the plating bath was as follows:

| nickel sulfaminate | 450 g/liter |
| boric acid | 30 g/liter |

The plating was carried out at a temperature of 45° C. and a current density of 3 A/dm² and for a plating time of 10 minutes to form a nickel coating layer 11 having a thickness of 4 to 5 microns.

The plate prepared above was further plated in copper plating bath having the following composition:

| copper pyrophosphate | 50 g/liter |
| metallic copper | 28 g/liter |
| potassium pyrophosphate | 150 g/liter |
| ammonia | 2 cc/liter |
| Glazing agent ("SP 67" manufactured by Kanto Kagaku K.K.) | a small amount |

The plating was conducted at a bath temperature of 55° C. and a current of 15 A/feet² and for a plating time of 110 minutes to form a copper layer of 24 μ. A wiring pattern was formed on the resulting copper layer by means of Way Coat IC Resist (manufactured by Hunt Co.), and an intaglio printing plate was obtained by etching it under the following conditions:

| Etching solution: | Ferric chloride 30 Be (Baume Concentration) |
|---|---|
| Bath temperature: | 24° C. |
| Etching machine: | Splashing type |

FIG. 2(c) is an explanatory sectional view of the intaglio printing plate thus obtained.

As a comparative example, the same wiring pattern as above was formed by applying Way Coat IC Resist directly to the same copper printing plate as in Example 1 and carrying out the etching under the same conditions as above.

The results shown in the table below, revealed that the plate of Example 4 provided a uniform depth of pattern.

| Line Width (microns) | Example (4) Plate depth (μ) | Comparative Example Plate Depth (μ) |
|---|---|---|
| 50 | 24 | 24 |
| 100 | 24 | 32 |
| 250 | 24 | 45 |

The plate of the comparative example gave printing ink coatings having thicknesses varying from 10 μ to 20 μ.

The plate of Example 4 provided a uniform reproduction without dropouts for pattern lines having line widths of 50 to 250 μ.

EXAMPLE 5

In accordance with the procedure of Example 1, a printing plate was used having a desired stripe design pattern with 524 lines, each line having a width of 50 μ, a pitch of 100 μ and a length of 100 mm, with the same stripe design pattern of 50 lines arranged at a distance of 0.2 mm form both sides of the first stripe design pattern and parallel thereto as a dummy pattern.

The procedure of Example 1 sometimes provided discontinuous reproduction of the outermost lines of the standard central pattern when using butyl carbitol acetate (b.p. 260.4° C.) as a diluting agent, and this may become an obstacle for continuous printing. The plate of Example 5 permitted stable reproduction with the use of butyl carbitol (b.p. 230°, 4° C.).

Using this pattern in the procedure of Example 1, the printed pattern tended to radially extend the distance of the lines somewhat when the stripe design of the pattern was placed in a position parallel to the printing direction (the direction of movement of the transferring cylinder). However, this tendency was negligible in this example.

EXAMPLE 6

Using a conductive silver ink prepared by three-roll milling an ink composition, the procedure of Example 1 was repeated to print. The ink composition was as follows:

| Silver powder "P 5200" (Shoei Kagaku Kogyo K.K.) | 65 percent by weight |
|---|---|
| Glass frit "SSG-202-B" (manufactured by Senyo Glass Ind. K.K.) | 6 percent by weight |
| Resinous varnish of the type curing in ultraviolet light | 29 percent by weight |

The ultraviolet ray curing type resinous varnish had the following composition:

| NK Ester "A-TMM-3" (Pre-polymer of oligoester polyvalent acrylate type, containing 1.07 moles of acryloid radicals with respect to 100 grams total weight of the varnish; manufactured by Shin-Nakamura Kagaku K.K.) | 93 percent by weight |
|---|---|
| Benzophenone | 5 percent by weight |
| Triethanol amine | 2 percent by weight |

The printing was fixed by irradiating the plate substrate with ultraviolet rays of 0.2 W/cm$^2$ for 30 seconds immediately after printing, whereby patterns having a line width of 40 μ and a layer thickness of 14 μ were reproduced. The separation of the ink from the transferring layer was found to be good and stable.

The printed pattern was fired for 3 hours at a maximum temperature of 580° C. by means of an endless belt furnace. The resulting pattern had no cracking, and the pattern lines were sharp without edge deformation. The pattern had good physical strength and provided a favorable conductivity with a final resistivity of 0.8 to 1.0 ohms/cm.

As a comparative example, an ink was used in which the ultraviolet light curing type resinous varnish was replaced by the following composition:

| nitrocellulose | 20 percent by weight |
|---|---|
| butyl carbitol | 50 percent by weight |
| butyl cellosolve | 30 percent by weight |

The similarly repeated printings gave coated patterns having a line width of 45 μ and a layer thickness of 13 μ. However, the pattern was still sticky and became flowable after standing for a while, resulting in pattern having a line width of 50 μ and a layer thickness of 10 μ. The fired pattern had cracks on its surface and local points having a resistivity higher than 2 ohms/cm. Transfer of the ink from the transferring layer to materials to be printed was found to be good and stable.

EXAMPLE 7

An ink was obtained by adding dimethylpolysiloxane oil ("FK 96 100 CS" of Shinetsu Silicone K.K.) to the ink composition of Example 6 in an amount of 3 percent by weight with respect to its total weight and three-roll milling the mixture. The ink was readily separable from the transferring layer to materials to be printed and secured a high resistance to printing even for 1,000 printings.

EXAMPLE 8

Using the transferring layer of Example 3 in accordance with the procedure of Example 1, printing was carried out on 20 glass plates to determine defects (pin holes and discontinued lines) in the printed patterns. The results are shown in the table below.

After the ink dried, a second printing was carried out at the same position and with the same printing press on ten of the above printed glass plate.

For the remaining ten glass plates a printing was conducted under the same condition as above with the exception that the transferring layer was withdrawn from the transferring cylinder and was re-installed, shifted 0.2 mm from the original position in the axial direction of the transferring cylinder. Then the above printed glass base sheet was set on the same press. The table below also shows the results concerning the defects (discontinued lines of the sample stripe design printed) appearing on the first printings and on the second printings in both the case of the transferring layer being shifted and the transferring layer not being shifted.

| Printing Conditions | No. of Samples | No. of Defects | Line width ($\mu$) |
|---|---|---|---|
| First Printings | 20 | 60–80 | 45–50 |
| Second Printings | | | |
| Transferring Layer Shifted | 10 | 15–35 | 50–55 |
| Transferring Layer Not Shifted | 10 | 1–14 | 50–55 |

It was found that the number of defects was decreased by shifting the transferring layer and that the increase in the line width by double printing was within the acceptable range for practical use.

EXAMPLE 9

A 30% solution (toluene: ethyl acetate = 1:1) of the following resin was filtered and coated on a float glass having a thickness 3 mm by means of a percolator immediately after filtration. The thickness of the coating was in the range of 5 to 10 $\mu$ at the time of coating.
(1) Acrylic Resin:
    "Dianal BRZ-85" manufactured by Mistubishi Rayon Co., Ltd.
    "B-66" manufactured by Rohm & Hass Co.
(2) Acrylic Adhesive:
    "Oribain 6084" manufactured by Toyo Ink Mfg. Co., Ltd.
    "PE-121" manufactured by Nippon Carbide Ind. Co., Ltd.
(3) Ethyl cellulose: "N-7" Hercules Incorporated.
(4) Nitrocellulose: "KC-2000" manufactured by Toyo ink Mfg. Co., Ltd.
(5) Isocyanate: "Coronate L" manufactured by Nippon Polyurethane Ind. Co., Ltd.

The coating was allowed to stand for 1 hour at room temperature and then dried at 120° C. for 15 minutes. After being cooled to room temperature, the cost was used for printing in accordance with the procedure of Example 1. After printing, the plate was fired 600° C. by means of an endless belt furnace. The results are shown below. The plate used had a line width of 100 $\mu$ and a line depth of 30 $\mu$.

| | Line Width after Printing (m) | Film Thickness of Straight Line (m) |
|---|---|---|
| Untreated Glass | 100–120 | 10 |
| Treated Glass | | |
| (1) | 80–100 | 13–14 |
| (2) | 70–80 | 15 |
| (3) | 80–100 | 13–14 |
| (4) | 80–100 | 13–14 |
| (5) | 80–100 | 13–14 |

The shapes of the pattern formed on the treated glasses were better than those on the untreated glass.

A phenolic resin ("pp 4507" of Gunei Kagaku K.K.) and a vinyl chloride resin ("QJ-1" of Tokyo Soda K.K.) were both applied in the same manner as in Example 9. The shapes of the pattern were broken after printing and firing.

EXAMPLE 10

In accordance with the procedure of Example 9, the minimum transferring pressure was determined by decreasing the pressure for transferring ink to materials to be printed from 5 kg/cm$^2$. The minimum pressure for untreated glass was 3.0 kg/cm$^2$, whereas the minimum pressures for the glasses treated with the resins (1), (3), (4) and (5) above were, respectively, 2 kg/cm$^2$. The minimum pressure for the glass treated by the resin (2) above was 1.5 kg/cm$^2$.

What is claimed is:

1. An intaglio offset thick film printing method comprising the steps of:
   providing first and second intaglio plates each having an ink receptacle of greater than 10 microns in depth, the pattern of each of said ink receptacles being of the same shape and each corresponding to a predetermined pattern to be printed, and said first and second intaglio plates being arranged in predetermined relationships with respect to a material to be printed;
   providing a transfer cylinder for transferring ink from said first and second intaglio plates to said transfer cylinder, said transfer cylinder having a surface transfer layer of a material selected from the group consisting of fluorine compounds and silicone compounds to impart separability to the surface of said transfer cylinder, and a resilient layer arranged beneath said transfer layer and having a rubber hardness of less than 30° Shore A;
   transferring ink from said first intaglio plate to said transfer cylinder at a pressure of less than 10 kg/cm$^2$ and at a transferring velocity of less than 100 mm/sec to form a first ink pattern in a first position on said transfer layer of said transfer cylinder, said first ink pattern on said transfer layer corresponding to said predetermined pattern of said ink receptacle in said first intaglio plate;
   printing said first ink pattern formed on said transfer layer of said transfer cylinder onto said material to be printed;
   shifting the position of said transfer layer with respect to said ink receptacles in said first and second intaglio plates without altering the positional relationships between said respective first and second intaglio plates and said material to be printed; and
   carrying out a superposition printing on said material to be printed by repeating said transferring and printing steps with said shifted transfer layer and with said second intaglio plate so that (i) ink from said second intaglio plate is transferred to said transfer cylinder to form a second ink pattern in a second position on said transfer layer of said transfer cylinder, said second ink pattern on said transfer layer corresponding to said first ink pattern and said second position on said transfer layer being displaced from said first position of said first ink pattern on said transfer layer, and (ii) said second ink pattern is then printed onto said material to be printed in superposition to said first ink pattern printed on said material to be printed.

2. The printing method of claim 1, further including the step of providing a cleaning roller for removing contamination and residual ink on the surface of said transfer layer of said transfer cylinder, said cleaning roller being arranged so that said cleaning roller is capable of contacting the surface of said transfer layer of said transfer cylinder.

3. The printing method of claim 1 wherein said step of shifting comprises rotational shifting said transfer layer relative to the axis of rotation of said transfer cylinder to move said transfer layer with respect to said first and second intaglio plates and said material to be printed.

4. The printing method of claim 1 wherein said step of shifting comprises axially shifting said transfer layer with respect to the axis of rotation of said transfer cylinder to move said transfer layer with respect to said first and second intaglio plates and said material to be printed.

5. The printing method of claim 3 wherein said step of shifting comprises sliding said transfer layer with respect to said transfer cylinder while maintaining the position of said transfer cylinder with respect to said first and second intaglio plates and said material to be printed.

6. The method of claim 3 wherein said step of shifting comprises moving said transfer cylinder relative to said first and second intaglio plates and said material to be printed to thereby shift said transfer layer.

7. The printing method of claim 1 wherein said resilient layer is comprised of a layer of compressible foamed material.

8. The printing method of claim 1 wherein said resilient layer is comprised of a layer of porous material.

9. The printing method of claim 1 further including the step of coating the surface of said transfer layer with a material selected from the group consisting of a silicone oil, silicone gum, and a silicone varnish, said material having a viscosity of less than 50 poises.

10. The printing method of claim 1 wherein said step of providing first and second intaglio plates comprises providing first and second intaglio base materials each having a uniform intaglio surface layer thereon, and etching said intaglio surface layers to a thickness corresponding to a predetermined desired plate depth for said intaglio plates, said step of etching being performed to produce a pattern in said intaglio surface layers which corresponds to said predetermined pattern to be printed.

11. The intaglio printing method of claim 10 wherein said step of etching said intaglio surface layers comprises providing first portions on said intaglio surface layers which are resistant to etching and second portions on said intaglio surface layers which are susceptible to etching, said second portions defining said pattern on said intaglio surface layers, etching said second portions of said intaglio surface layers, and stopping said etching of said second portions when said second portions reach said intaglio base materials.

12. The printing method of claim 1 wherein said step of providing first and second intaglio plates comprises forming at least a portion of each of said ink receptacles of said first and second intaglio plates from a collective body of small lines having line widths from 40 to 200 microns and at least one connection between said small lines, said collective body of small lines defining a large design pattern having a width greater than 300 microns.

13. The printing method of claim 1 wherein said first and second intaglio plates each have a fine line pattern thereon containing a plurality of fine lines having line widths of less than 100 microns and a dummy pattern arranged in an area adjacent to the outermost fine lines of said fine line pattern.

14. The printing method of claim 1 further including the step of providing a printing ink in said ink receptacles of said first and second intaglio plates, said printing ink including a printing ink vehicle containing a material selected from polysiloxane oil and organopolysiloxane denatured resin, said material of said printing ink vehicle being in an amount less than 50 percent by weight of the total amount of said printing ink vehicle.

15. The printing method of claim 1 further including the step of providing an ink composition in said ink receptacles of said first and second intaglio plates for transfer to said transfer cylinder and the step of firing the ink patterns printed on said material to be printed, and wherein said ink composition is such as to contain from about 60 to about 95 percent by weight of solids remaining after said step of firing and from about 5 to about 40 percent by weight of a resinous varnish of a type which may be cured by untraviolet light.

16. The printing method of claim 15 wherein said ink composition comprises glass frit and a solid material which is to remain after said firing step, said solid material being selected from the group consisting of a conductive material, a resistance material, a magnetic material, a dielectric material, and a fluorescent material.

17. The printing method of claim 15 wherein said resinous varnish contains from about 0.04 to about 1.50 moles of a radical selected from an acryloyl radical and a methacryloyl radical with respect to 100 grams of the total amount of said varnish.

18. The printing method of claim 17 wherein said resinous varnish further contains a polyester resin.

19. The printing method of claim 1 further including the step of coating the surface of said material to be printed with a material comprising a resin selected from an acrylic resin, a nitrocellulose resin, an ethyl cellulose resin and an isocyanate resin, said coating step being performed prior to said transfer step and being performed to provide a coating thickness of between 1 and 20 microns.

20. The printing method of claim 1, further including the steps of providing additional intaglio plates each having an ink receptacle of the same shape as said ink receptacles of said first and second intaglio plates, and repeating said shifting and carrying out steps with respect to said additional intaglio plates, the number of said additional intaglio plates corresponding to the number of additional superposition printings to be carried out.

21. The method of claim 1, further including the step of providing the same printing ink in said ink receptacles of said first and second intaglio plates.

22. The printing method of claim 4 wherein said step of shifting comprises sliding said transfer layer with respect to said transfer cylinder while maintaining the position of said transfer cylinder with respect to said first and second intaglio plates and said material to be printed.

23. The method of claim 4 wherein said step of shifting comprises moving said transfer cylinder relative to said first and second intaglio plates and said material to be printed to thereby shift said transfer layer.

24. The printing method of claim 16 wherein said resinous varnish contains from about 0.04 to about 1.50 moles of a radical selected from an acryloyl radical and a methacryloyl radical with respect to 100 grams of the total amount of said varnish.

25. The printing method of claim 24 wherein said resinous varnish further contains a polyester resin.

26. An intaglio offset thick film printing method comprising the steps of:
 providing first and second intaglio plates each having an ink receptacle therein, the pattern of each of said ink receptacles being of the same shape and each corresponding to a predetermined pattern to be printed;
 providing a transfer cylinder for transferring ink from said first and second intaglio plates to said transfer cylinder, said transfer cylinder having a surface transfer layer of a material suitable for imparting separability to the surface of said transfer cylinder;
 transferring ink from said first intaglio plate to said transfer cylinder in a manner to form a first ink pattern in a first position on said transfer layer of said transfer cylinder, said first ink pattern of said transfer layer corresponding to said predetermined pattern of said ink receptacle in said first intaglio plate;
 printing said first ink pattern formed on said transfer layer of said transfer cylinder onto a material to be printed;
 thereafter transferring ink from said second intaglio plate to said transfer cylinder in a manner to form a second ink pattern in a second position on said transfer layer of said transfer cylinder, said second ink pattern on said transfer layer corresponding to said first ink pattern and said second position on said transfer layer being displaced from said first position of said first ink pattern on said transfer layer; and
 printing said second ink pattern formed on said transfer layer of said transfer cylinder onto said material to be printed in direct superposition to said first ink pattern printed on said material to be printed.

27. The printing method of claim 26, further including the step of providing additional intaglio plates each having an ink receptacle of the same shape as said ink receptacles of said first and second intaglio plates; and repeating said second transferring and second printing steps with respect to said additional intaglio plates so as to form additional ink patterns in additional positions on said transfer layer of said transfer cylinder, and thereafter printing said additional ink patterns formed on said transfer layer of said transfer cylinder onto said material to be printed in direct superposition to said first and second ink patterns printed on said material to be printed, said additional ink patterns formed on said transfer layer corresponding to said first and second ink patterns and said additional positions on said transfer layer each being displaced from said first and second positions of said first and second ink patterns respectively on said transfer layer.

28. The printing method of claim 26 further including the step of providing the same ink in said ink receptacles of said first and second intaglio plates.

29. The printing method of claim 26 wherein each of said transferring steps are performed at a pressure of less than 10 kg/cm$^2$ and at a transferring velocity of less than 100 mm/sec.

30. The printing method of claim 26 wherein said surface transfer layer of said transfer cylinder is of a material selected from the group consisting of fluorine compounds and silicone compounds, and wherein said tranfer cylinder further includes a resilient layer arranged beneath said transfer layer and having a rubber hardness of less than 30° Shore A.

31. The printing method of claim 26 wherein said second transferring step is accomplished by shifting the position of said transfer layer with respect to said ink receptacles in said first and second intaglio plates without altering the positional relationships between said respective first and second intaglio plates and said material to be printed, and then moving said shifted transfer layer of said transfer cylinder along said second intaglio plate to thereby transfer ink from said ink receptacles of said second intaglio plate onto said shifted transfer layer to form said second ink pattern in said second position on said transfer layer.

* * * * *

UNITED STATES PATENT AND TRADEMARK OFFICE
CERTIFICATE OF CORRECTION

PATENT NO. : 4,479,432
DATED : October 30, 1984
INVENTOR(S) : Tatsuo Masaki, et al.

It is certified that error appears in the above-identified patent and that said Letters Patent are hereby corrected as shown below:

Column 15, line 22, "82" should read --µ--.
Column 16, line 67, after "current" insert --density--.
Column 17, line 52, "230°" should read --230--.
Column 19, line 39, "BRZ" should read --BR--.

Signed and Sealed this

Twenty-fifth Day of June 1985

[SEAL]

Attest:

DONALD J. QUIGG

Attesting Officer   Acting Commissioner of Patents and Trademarks